United States Patent
Lius

(10) Patent No.: US 12,191,314 B2
(45) Date of Patent: Jan. 7, 2025

(54) ELECTRONIC DEVICE

(71) Applicant: InnoLux Corporation, Miao-Li County (TW)

(72) Inventor: Chandra Lius, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/199,973

(22) Filed: May 21, 2023

(65) Prior Publication Data

US 2023/0299093 A1  Sep. 21, 2023

Related U.S. Application Data

(63) Continuation of application No. 17/347,585, filed on Jun. 15, 2021, now Pat. No. 11,695,021.

(30) Foreign Application Priority Data

Jul. 15, 2020 (CN) .......................... 202010679747.X

(51) Int. Cl.
*H01L 27/12* (2006.01)

(52) U.S. Cl.
CPC .................................. *H01L 27/124* (2013.01)

(58) Field of Classification Search
CPC ..................... G02F 1/133377; H01L 27/124
See application file for complete search history.

(56) References Cited

U.S. PATENT DOCUMENTS

| | | | |
|---|---|---|---|
| 2011/0007047 A1* | 1/2011 | Fujioka | G02F 1/133509 345/207 |
| 2012/0194773 A1* | 8/2012 | Kim | G09G 3/3666 349/139 |
| 2019/0221185 A1* | 7/2019 | Grossman | H04N 7/0117 |
| 2020/0394983 A1 | 12/2020 | Huang | |

FOREIGN PATENT DOCUMENTS

CN    110619836 A    12/2019

OTHER PUBLICATIONS

CN 110619836 machine translation (Year: 2019).*

* cited by examiner

*Primary Examiner* — James A Dudek
(74) *Attorney, Agent, or Firm* — Winston Hsu

(57) ABSTRACT

An electronic device includes a display panel including a first area and a second area, a first optical sensing module disposed corresponding to the first area, and a second optical sensing module disposed corresponding to the second area. The first area includes a plurality of first pixels and a plurality of first signal lines electrically connected with the first pixels. The second area includes a plurality of second pixels and a plurality of second signal lines electrically connected with the second pixels, wherein a transmittance of the second area is greater than a transmittance of the first area.

12 Claims, 10 Drawing Sheets

ELECTRONIC DEVICE

CROSS REFERENCE TO RELATED APPLICATIONS

This application is a continuation application of U.S. application Ser. No. 17/347,585, filed on Jun. 15, 2021. The content of the application is incorporated herein by reference.

BACKGROUND OF THE DISCLOSURE

1. Field of the Disclosure

The present disclosure relates to an electronic device, and more particularly to an electronic device having different transmittances in different area.

2. Description of the Prior Art

In recent years, as the requirements of the user for electronic devices have become higher, components in the electronic device, such as optical sensors, can be disposed under the screen to improve the screen-to-body ratio in the electronic device. However, because different types of optical sensors have different requirements for light transmittance, to improve the transmittance design of electronic devices has become an important issue in the electronic industry.

SUMMARY OF THE DISCLOSURE

In some embodiments, an electronic device is provided by the present disclosure, wherein the electronic device includes a display panel including a first area and a second area, a first optical sensing module disposed corresponding to the first area, and a second optical sensing module disposed corresponding to the second area. The first area includes a plurality of first pixels and a plurality of first signal lines electrically connected with the first pixels. The second area includes a plurality of second pixels and a plurality of second signal lines electrically connected with the second pixels, wherein a transmittance of the second area is greater than a transmittance of the first area.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
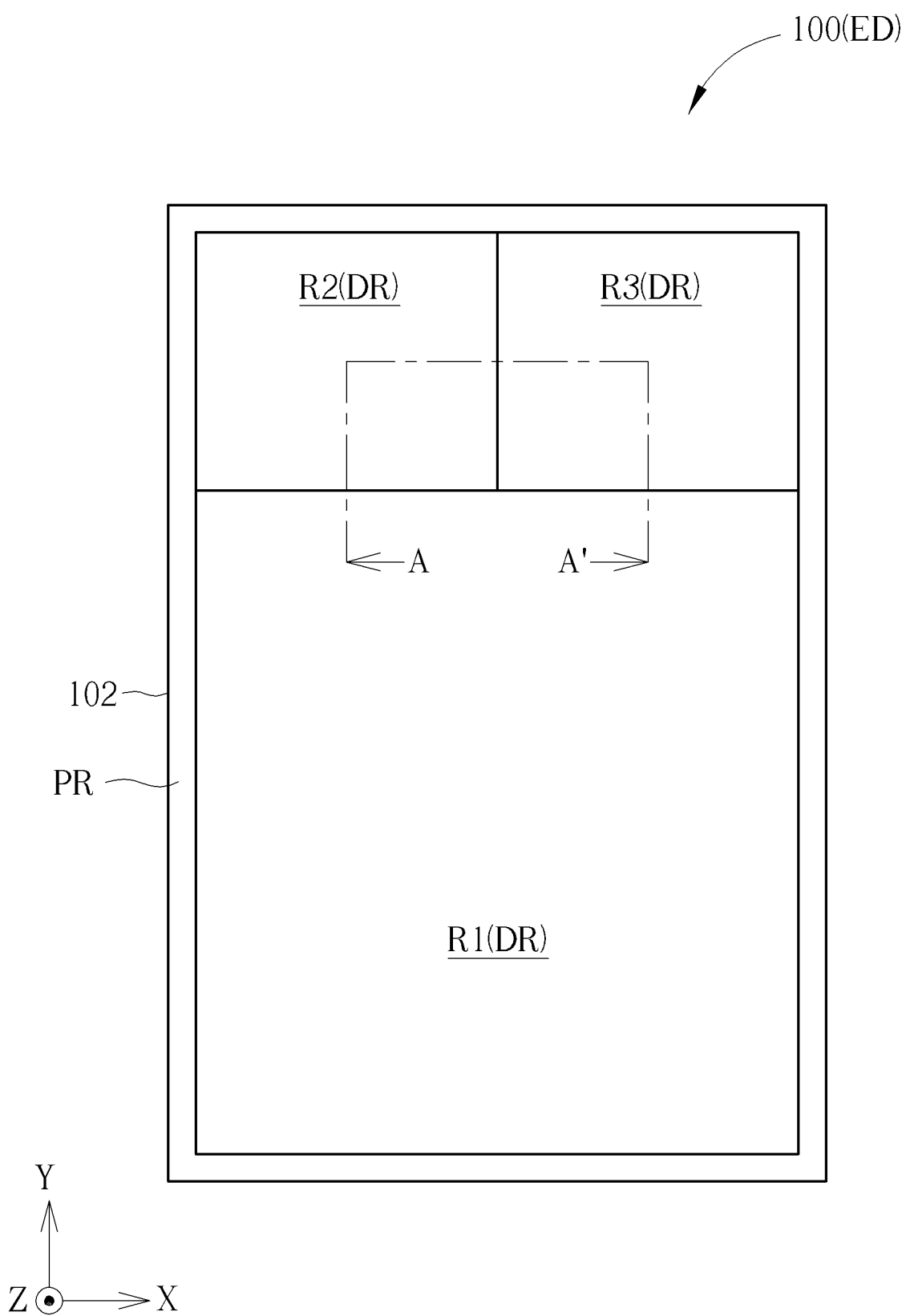
FIG. 1 schematically illustrates a top view of an electronic device according to a first embodiment of the present disclosure.
Figure 2:
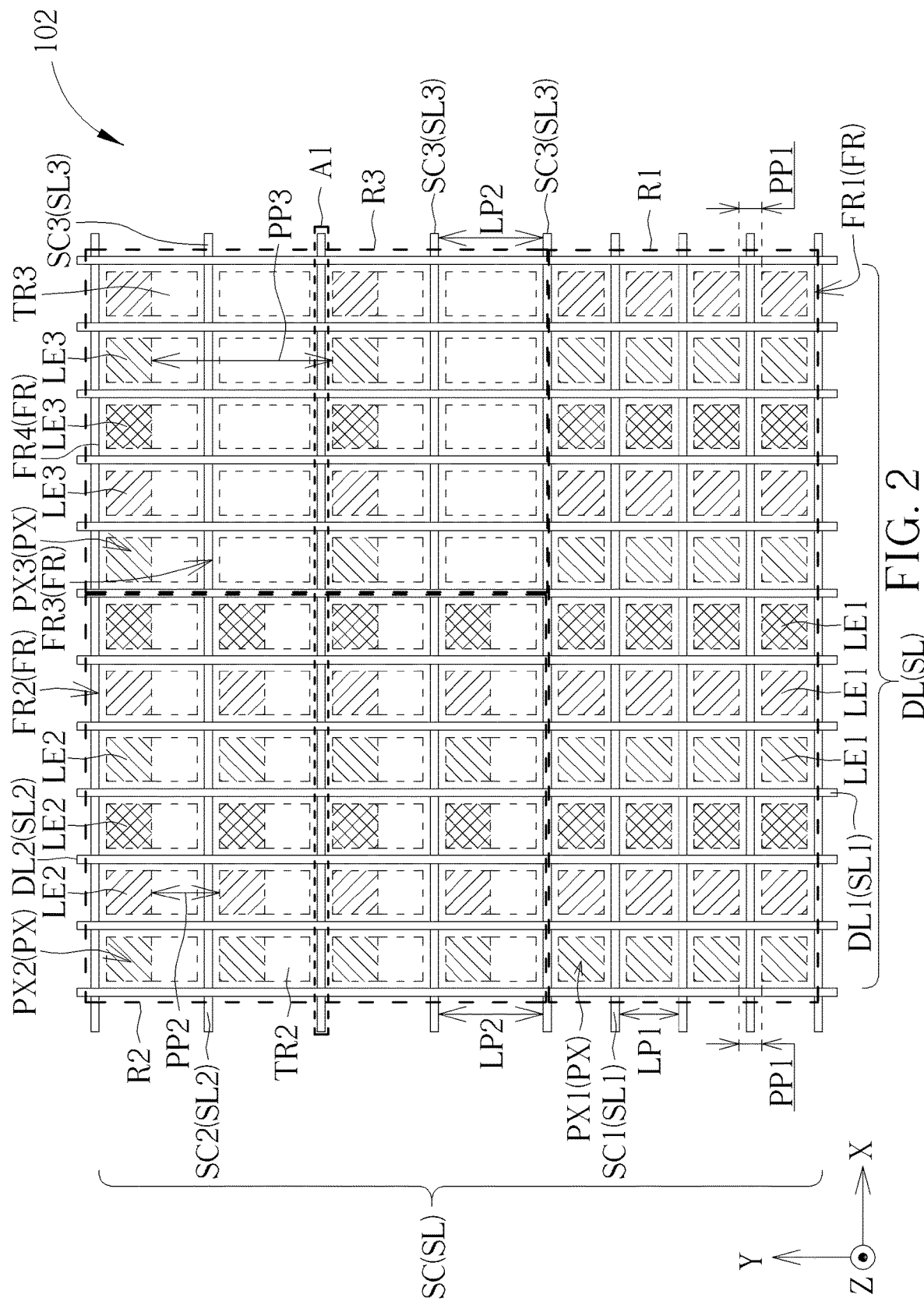
FIG. 2 schematically illustrates pixels of a display panel according to the first embodiment of the present disclosure.

Referring to FIG. 1 and FIG. 2, FIG. 1 schematically illustrates a top view of an electronic device according to a first embodiment of the present disclosure, and FIG. 2 is an enlarged schematic diagram of a portion of pixels of a display panel according to the first embodiment of the present disclosure. As shown in FIG. 1, the electronic device ED may include a display device 100 which can display static or dynamic images or screens according to the demands and operations of users, but not limited thereto. The display device 100 may for example be applied to laptops, common displays, tiled displays, vehicle displays, touch displays, television, surveillance cameras, smart phones, tablets, light source modules, light emitting devices or electronic devices of the above-mentioned products, but not limited thereto. As shown in FIG. 1, the display device 100 may include a display panel 102, wherein the display panel 102 of the present embodiment may for example include a self-emissive display panel or a non-self-emissive display panel, but not limited thereto. In detail, the display panel 102 of the present embodiment may for example include elements or layers such as substrate, driving element(s), light emitting element(s), encapsulation layer(s), and the like (not shown in FIG. 1), wherein the light emitting unit of the display panel 102 may include light emitting diodes when the display panel 102 includes the self-emissive display panel. The light emitting diodes may for example include organic light emitting diodes (OLED), quantum light-emitting diode (QLED or QDLED), inorganic light emitting diodes, other suitable light emitting units or the combinations of the above-mentioned materials, but not limited thereto. For example, when the display panel 102 includes an organic light emitting diode display panel, the display panel 102 may for example include elements or layers such as lower substrate, driving element, organic light emitting diode element, upper substrate and/or encapsulation layer. In addition, when the display panel 102 include a flexible organic light emitting diode display panel, the display panel 102 may for example include elements or layers such as supporting layer, flexible substrate, driving element, organic light emitting diode element and/or encapsulation layer, but not limited thereto. The inorganic light emitting diodes mentioned above may for example include mini light emitting diodes (mini LED) or micro light emitting diodes (micro LED), but not limited thereto. In an embodiment, the chip size of the light emitting diode may range from 300 micrometers (μm) to 10 millimeters (mm), the chip size of the mini light emitting diode may range from 100 micrometers to 300 micrometers, and the chip size of the micro light emitting diode may range from 1 micrometer to 100 micrometers, but not limited thereto. In some embodiments, the display panel 102 may include non-self-emissive display panel such as liquid crystal display panel, but not limited thereto.

As shown in FIG. 1, the display panel 102 may include a peripheral region PR and a display region DR. In detail, when the display panel 102 includes the self-emissive display panel, the display panel 102 may for example include a plurality of light emitting units and a plurality of driving elements (not shown in FIG. 1), wherein a pixel or a sub-pixel (denoted by pixel hereinafter) of the display panel 102 may for example be a smallest unit that forms the images of the display panel. For example, each of the pixels may include a light emitting unit and the driving element corresponding to the light emitting unit, but not limited thereto. When the display panel 102 includes the non-self-emissive display panel, the display panel 102 may for example include a plurality of light modulating units and a plurality of driving elements, wherein each of the pixels of the display panel 102 may for example include a light modulating unit and the driving element corresponding to the light modulating unit, but not limited thereto. According to the present embodiment, the display region DR may for example be defined as the region enclosed by the outer edge of the outermost pixels among the plurality of pixels, but not limited thereto. In addition, the region of the display panel 102 other than the display region DR may be defined as the peripheral region PR, but not limited thereto. The definitions of the pixels, the peripheral region PR and the display region DR mentioned above may be applied to each of the embodiments of the present disclosure, and will not be redundantly described in the following.

Figure 3:
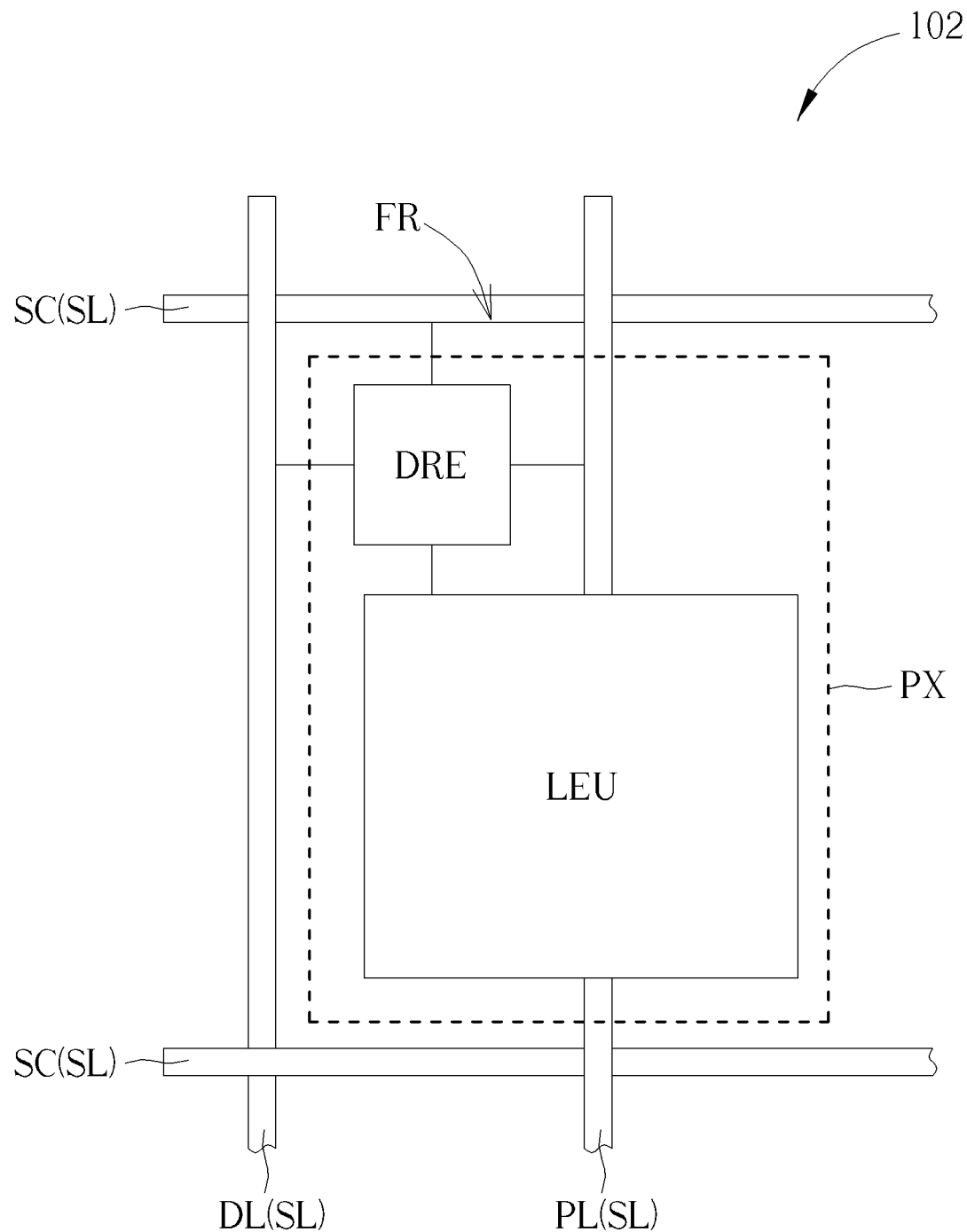
FIG. 3 schematically illustrates a partial view of a display panel according to a variant embodiment of the first embodiment of the present disclosure.

Referring to FIG. 2, FIG. 3 as well as FIG. 1, according to the present embodiment, the display panel 102 may include a first area R1, a second area R2 and a third area R3, wherein the combined total area of the first area R1, the second area R2, and the third area R3 may substantially correspond to the display region DR of the display panel 102 as shown in FIG. 1, or in other words, the display region DR may be divided into the first area R1, the second area R2 and the third area R3, but not limited thereto. According to the present embodiment, the display panel 102 may include a plurality of pixels and a plurality of signal lines electrically connected with the pixels, wherein the pixels may be disposed in the regions enclosed by the signal lines of the display panel 102, but not limited thereto. In other words, the pixels may be defined as the regions enclosed by the signal lines. For example, the signal lines SL shown in FIG. 2 may for example be arranged along a first direction X or a second direction Y and enclose a plurality of areas FR, wherein the pixels PX may for example be disposed in the areas FR, or in other words, the pixels PX may not be overlapped with the signal lines SL in a direction Z, but not limited thereto. In some embodiments, the pixel PX may not be disposed within the area FR. For example, FIG. 3 schematically illustrates a partial view of a display panel according to a variant embodiment of the first embodiment of the present disclosure. As shown in FIG. 3, a pixel PX of the display panel 102 may include a light emitting unit LEU and a driving element DRE electrically connected to the light emitting unit LEU. The description of the light emitting unit LEU may refer to the above-mentioned contents, and will not be redundantly described here. The driving element DRE may for example include thin film transistors (TFT), other suitable driving elements or the combinations of the above-mentioned elements, but not limited thereto. As mentioned above, a pixel PX may include a light emitting unit and a driving element corresponding to (or electrically connected to) the light emitting unit. Therefore, as shown in FIG. 3, each of the pixels PX of the display panel 102 may include a light emitting unit LEU and a driving element DRE electrically connected to the light emitting unit LEU, and the driving element DRE may for example be electrically connected to the signal lines SL of the display panel 102. The signal line SL may for example include a data line DL, a scan line SC and a power line PL, but not limited thereto. In the variant embodiment shown in FIG. 3, the pixel PX may be overlapped with a signal line SL (such as the power line PL shown in FIG. 3) in the direction Z, but not limited thereto. In other words, the pixel PX may not be disposed within the area FR in the direction Z, but not limited thereto. The disposition of the pixel PX shown in FIG. 3 may be applied to each of the embodiments and variant embodiments of the present disclosure, and will not be redundantly described in the following.

Referring to FIG. 2 again, according to the present embodiment, in the coverage of the first area R1, the second area R2 and the third area R3, a plurality of pixels PX and a plurality of signal lines SL are respectively included, but not limited thereto. For example, as shown in FIG. 2, a portion of the pixels PX and a portion of the signal lines SL located in the first area R1 may be called as the first pixels PX1 and the first signal lines SL1 respectively, wherein the first signal lines SL1 may be electrically connected with the first pixels PX1; a portion of the pixels PX and a portion of the signal lines SL located in the second area R2 may be called as the second pixels PX2 and the second signal lines SL2 respectively, wherein the second signal lines SL2 may be electrically connected with the second pixels PX2; a portion of the pixels PX and a portion of the signal lines SL located in the third area R3 may be called as the third pixels PX3 and the third signal lines SL3 respectively, wherein the third signal lines SL3 may be electrically connected with the third pixels PX3. That is, the first area R1 of the display panel 102 may include a plurality of first pixels PX1 and a plurality of first signal lines SL1 electrically connected with the first pixels PX1, the second area R2 of the display panel 102 may include a plurality of second pixels PX2 and a plurality of second signal lines SL2 electrically connected with the second pixels PX2, and the third area R3 of the display panel 102 may include a plurality of third pixels PX3 and a plurality of third signal lines SL3 electrically connected with the third pixels PX3 in the present embodiment, but not limited thereto. It should be noted that the disposition method of the first pixels PX1 and the first signal lines SL1 in the first area R1, the disposition method of the second pixels PX2 and the second signal lines SL2 in the second area R2 and the disposition method of the third pixels PX3 and the third signal lines SL3 in the third area R3 may respectively refer to the disposition method shown in FIG. 2 or FIG. 3, and the disposition methods of the pixels and the signal lines in the first area R1, the second area R2 and the third area R3 may be the same or different, the present disclosure is not limited thereto. It should be noted that the first signal lines SL1, the second signal lines SL2 and the third signal lines SL3 are defined according to the area where the signal lines are located in the present embodiment, and a signal line SL of the display panel 102 may have different names in different areas. For example, as shown in the portion A1 of FIG. 2, a portion of the signal line SL located in the second area R2 may be the second signal SL2, and another portion of the signal line SL located in the third area R3 may be the third signal line SL3, but not limited thereto. In addition, the first pixels PX1, the second pixels PX2 and the third pixels PX3 are defined according to the location or the region where the pixel PX is located in the present embodiment, which is not defined according to the type of the pixels PX. In detail, the first pixels PX1, the second pixels PX2 and the third pixels PX3 may respectively include the pixels of a single color or the pixels of various kinds of colors according to the use and the design of the display panel 102. For example, as shown in FIG. 2, each of the first pixels PX1 may include a first light emitting region LE1, each of the second pixels PX2 may include a second light emitting region LE2, and each of the third pixels PX3 may include a third light emitting region LE3, wherein the first light emitting region LE1 may for example include a light emitting region emitting light of three colors (such as red, green and blue, but not limited thereto), and the second light emitting region LE2 and the third light emitting region LE3 may respectively include a light emitting region emitting light of three colors (such as red, green and blue, but not limited thereto), but not limited thereto. The signal lines SL of the present embodiment may for example include any wire that can transmit signals to the pixels PX, such as scan lines and data lines, but not limited thereto. For example, as shown in FIG. 2, the signal lines SL of the display panel 102 may include the scan lines SC and the data lines DL, the scan lines SC may for example extend along the first direction X, and the data lines DL may for example extend along the second direction Y in the present embodiment, but not limited thereto. The first signal lines SL1 in the first area R1 may for example include first scan lines SC1 and first data lines DL1, wherein the first signal lines SL1 may transmit signals to the first pixels PX1 which are electrically connected to the first signal lines SL1; the second signal lines SL2 in the second area R2 may for example include second scan lines SC2 and second data lines DL2, wherein the second signal lines SL2 may transmit signals to the second pixels PX2 which are electrically connected to the second signal lines SL2; the third signal lines SL3 in the third area R3 may for example include third scan lines SC3 and third data lines DL3, wherein the third signal lines SL3 may transmit signals to the third pixels PX3 which are electrically connected to the third signal lines SL3, but not limited thereto. In some embodiments, although it is not shown in FIG. 2 the signal lines SL may further include power lines (or VDD signal lines), and the present disclosure is not limited thereto. It should be noted that although the first direction X and the second direction Y are perpendicular to each other in the structure shown in FIG. 2, the present disclosure is not limited thereto. In addition, the position of the first area R1, the position of the second area R2 and the position of the third area R3 in the display panel 102 shown in FIG. 1 are exemplary, and the present disclosure is not limited thereto. In different embodiments, the positions of the first area R1, the second area R2 and the third area R3 may be changed according to the demands of the design.

According to the present embodiment, the density of the first pixels PX1, the density of the second pixels PX2 and the density of the third pixels PX3 may be different from each other in the display panel 102, but not limited thereto. The "density of the pixels" mentioned above may for example be defined as the number of the pixels in an unit area. As an example, the density of the first pixels PX1 may be the number of the first pixels PX1 in an unit area, but not limited thereto. The definition of the density of the pixels mentioned above may be applied to each of the embodiments and variant embodiments of the present disclosure, and will not be redundantly described in the following. As shown in FIG. 2, the scan lines SC extending along the first direction X in the display panel 102 of the present embodiment may have different densities in different areas, wherein the density of the scan lines SC may for example be defined as the number of the scan lines SC in an unit area, but not limited thereto. As shown in FIG. 2, the scan lines SC of the display panel 102 may have a greater density in the first area R1, and the scan lines SC may have a lower density in the second area R2 and the third area R3, or in other words, the density of the first scan lines SC1 may be greater than the density of the second scan lines SC2 and the density of the third scan lines SC3, but not limited thereto. In the present embodiment, a line pitch LP1 may be included between adjacent two of the first scan lines SC1 in the first area R1, and a line pitch LP2 may be included between adjacent two of the second scan lines SC2 in the second area R2 and adjacent two of the third scan lines SC3 in the third area R3. Because the density of the first scan lines SC1 may be greater than the density of the second scan lines SC2 and the density of the third scan lines SC3, the line pitch LP2 may be greater than the line pitch LP1 in the present embodiment, but not limited thereto. According to the present embodiment, because the line pitch LP2 is greater than the line pitch LP1, the areas (such as the area FR2) enclosed by the signal lines SL in the second area R2 and the third area R3 may have a greater area comparing to the areas (such as the area FR1) enclosed by the signal lines SL in the first area R1, but not limited thereto. In addition, according to the present embodiment, the design of the first light emitting regions LE1 of the first pixels PX1 may be the same as the design of the second light emitting regions LE2 of the second pixels PX2 and the design of the third light emitting regions LE3 of the third pixels PX3, but not limited thereto. In detail, as mentioned above, the first light emitting regions LE1, the second light emitting regions LE2 and the third light emitting regions LE3 may respectively include light emitting regions emitting light of different colors, that is, the first light emitting regions LE1, the second light emitting regions LE2 and the third light emitting regions LE3 are defined according to the position of the light emitting regions, which are not defined according to the colors or the types of the light emitting regions. When the first pixels PX1, the second pixels PX2 and the third pixels PX3 respectively includes the pixels of various kinds of color such as red, blue and green, "the design of the first light emitting regions LE1 of the first pixels PX1 may be the same as the design of the second light emitting regions LE2 of the second pixels PX2 and the design of the third light emitting regions LE3 of the third pixels PX3" mentioned above may represent that the red first light emitting region LE1, the red second light emitting region LE2 and the red third light emitting region LE3 may have the same area, the green first light emitting region LE1, the green second light emitting region LE2 and the green third light emitting region LE3 may have the same area, and the blue first light emitting region LE1, the blue second light emitting region LE2 and the blue third light emitting region LE3 may have the same area. According to the present embodiment, as mentioned above, because the areas (such as the area FR2 and the area FR4) enclosed by the signal lines SL in the second area R2 and the third area R3 may have a greater area than the areas (such as the area FR1) enclosed by the signal lines SL in the first area R1, the density of the second pixels PX2 disposed in a greater area (area FR2) and the density of the third pixels PX3 disposed in a greater area (area FR4) may be lower than the density of the first pixels PX1 disposed in a lower area (area FR1), but not limited thereto. In addition, a portion of the area FR (such as the area FR3) enclosed by the third signal lines SL3 in the third area R3 may include a transparent area and not include the third pixel PX3, wherein the transparent area may for example correspond to any suitable transparent material of the display panel 102 such as transparent conductive materials, but not limited thereto. Therefore, the density of the second pixels PX2 may be greater than the density of the third pixels PX3 in the present embodiment. That is, the density of the first pixels PX1 may be greater than the density of the second pixels PX2, and the density of the second pixels PX2 may be greater than the density of the third pixels PX3 in the present embodiment, but not limited thereto. In addition, as mentioned above, because the area FR2 and the area FR4 may have a greater area than the area FR1 in the present embodiment, and the design of the first pixels PX1 may be the same as the design of the second pixels PX2 and the design of the third pixels PX3, the area (such as the area FR2 and/or the area FR4) with a greater area may further include a transparent area in addition to the second pixel PX2 and/or the third pixel PX3, but not limited thereto. In detail, as shown in FIG. 2, a single area (area FR2) in the second area R2 may for example include the second pixel PX2 and a second transparent area TR2, and a single area (area FR4) in the third area R3 may for example include the third pixel PX3 and a third transparent area TR3. In the present embodiment, the second transparent area TR2 and the third transparent area TR3 may for example correspond to any suitable transparent material of the display panel 102, such as the transparent conductive materials, but not limited thereto. Because the areas (such as the area FR2 and/or the area FR4) including the second pixels PX2 and/or the third pixels PX3 may further include the transparent areas, the pixel pitch of the second pixels PX2 and the pixel pitch of the third pixels PX3 may be greater than the pixel pitch of the first pixels PX1. The "pixel pitch" mentioned above may for example be defined as the distance between adjacent two of the pixels (or adjacent two of the light emitting regions of the pixels), but not limited thereto. In detail, as shown in FIG. 2, a pixel pitch PP1 may be included between adjacent two of the first pixels PX1 in the second direction Y, wherein the pixel pitch PP1 may be the distance between adjacent two of the first pixels PX1 (or first light emitting regions LE1). In another aspect, a pixel pitch PP2 may be included between adjacent two of the second pixels PX2 in the second direction Y, wherein the pixel pitch PP2 may be the distance between adjacent two of the second pixels PX2 (or second light emitting regions LE2). Similarly, a pixel pitch PP3 may be included between adjacent two of the third pixels PX3 in the second direction Y, wherein the pixel pitch PP3 may be the distance between adjacent two of the third pixels PX3 (or third light emitting regions LE3). In the embodiment shown in FIG. 2, the areas of the first pixel PX1, the second pixel PX2 and the third pixel PX3 may substantially be the same. However, because the areas FR (such as the area FR2) including the second pixels PX2 may further include the second transparent areas TR2, and the areas FR (such as the area FR4) including the third pixels PX3 may further include the third transparent areas TR3, the pixel pitch PP2 and the pixel pitch PP3 may be greater than the pixel pitch PP1. In addition, because a portion of the areas (such as the area FR3) enclosed by the signal lines SL in the third area R3 may not include the third pixel PX3, the pixel pitch PP3 may be greater than the pixel pitch PP2 in the present embodiment, but not limited thereto. That is, the pixel pitch PP1 of the first pixels PX1 may be lower than the pixel pitch PP2 of the second pixels PX2, and the pixel pitch PP2 of the second pixels PX2 may be lower than the pixel pitch PP3 of the third pixels PX3, but not limited thereto. It should be noted that the areas (such as the area FR3) not corresponding to the third pixel PX3 shown in FIG. 2 may correspond to any suitable transparent material of the display panel 102, which is similar to the second transparent area TR2 and the third transparent area TR3, but not limited thereto. In addition, the shape of the pixels, the shape of the transparent areas and the disposition of the signal lines shown in FIG. 2 are just exemplary, and the present disclosure is not limited thereto. According to the present embodiment, as mentioned above, the density of the first pixels PX1 may be greater than the density of the second pixels PX2, and the density of the second pixels PX2 may be greater than the density of the third pixels PX3 in the display panel 102, wherein the areas (area FR2) including the second pixels PX2 and/or the areas (area FR4) including the third pixels PX3 may for example include the transparent areas. Therefore, the transmittance of the third area R3 may be greater than the transmittance of the second area R2, and the transmittance of the second area R2 may be greater than the transmittance of the first area R1 in the present embodiment, but not limited thereto. It should be noted that the transmittance mentioned above may for example be defined as the average transmittance of the light in an unit area, for example, the transmittance of the first area R1 may for example be the average transmittance of the light in an unit area of the first area R1, but not limited thereto. In addition, when comparing the transmittances of the first area R1, the second area R2, and the third area R3, the average transmittances of the first area R1, the second area R2 and the third area R3 may be measured under the same unit area, but not limited thereto. In detail, as shown in FIG. 2, the ratio of the area of the transparent areas (such as the third transparent area TR3 and the area FR3) in the third area R3 may be greater than the ratio of the area of the transparent areas (such as the second transparent area TR2) in the second area R2, and the ratio of the area of the transparent areas in the second area R2 may be greater than the ratio of the area of the transparent area (for example, no transparent area is included in the first area R1) in the first area R1 in the display panel 102. Because the transmittances of different areas of the display panel 102 may be different, and the transmittance in an area may be increased as the ratio of the area of the transparent area in the area increases, the transmittance of the third area R3 may be greater than the transmittance of the second area R2, and the transmittance of the second area R2 may be greater than the transmittance of the first area R1 in the present embodiment, but not limited thereto. It should be noted that although the density of the first pixels, the density of the second pixels and the density of the third pixels are different from each other through the transparent area in the present embodiment, the present disclosure is not limited thereto. In some embodiments, the area of the first pixel PX1, the area of the pixel PX2 and the area of the pixel PX3 may not be exactly the same to achieve the effect of different densities.

As mentioned above, the first area R1, the second area R2 and the third area R3 in the display panel 102 may have different transmittances in the present embodiment, wherein the difference between the transmittance of the first area R1, the transmittance of the second area R2 and the transmittance of the third area R3 may be achieved by making the density of the first pixels PX1, the density of the second pixels PX2 and the density of the third pixels PX3 different from each other, but not limited thereto. Because the first area R1, the second area R2 and the third area R3 of the display panel 102 may have different transmittances, different elements (such as the optical elements) of the electronic device 100 may be disposed corresponding to the first area R1, the second area R2 or the third area R3 according to the requirement of the transmittance of the elements (optical elements), such that the function of the optical elements may be improved. For example, because the transmittance of the third area R3 is greater, the elements of the electronic device 100 with higher requirement of the transmittance may for example be disposed corresponding to the third area R3, but not limited thereto. It should be noted that the present disclosure with the different transmittances of the first area R1, the second area R2 and the third area R3 from each other is not limited to the design by adjusting the density of the scan lines SC in different areas to make the density of the first pixels PX1, the density of the second pixels PX2 and the density of the third pixels PX3 different from each other in the present embodiment. In some embodiments, according to the design of the display panel 102, the density of the data lines DL may be different in different areas, such that the density of the first pixels PX1, the density of the second pixels PX2 and the density of the third pixels PX3 may be different from each other, but not limited thereto.

Other embodiments or variant embodiments of the present disclosure will be described in the following, which detail the designs of the first area R1, the second area R2 and the third area R3 to make the transmittance of the first area R1, the transmittance of the second area R2 and the transmittance of the third area R3 different from each other. In order to simplify the description, the same elements or layers in the present embodiment and the following embodiments would be labeled with the same symbol, and the features thereof will not be redundantly described.

Figure 4:
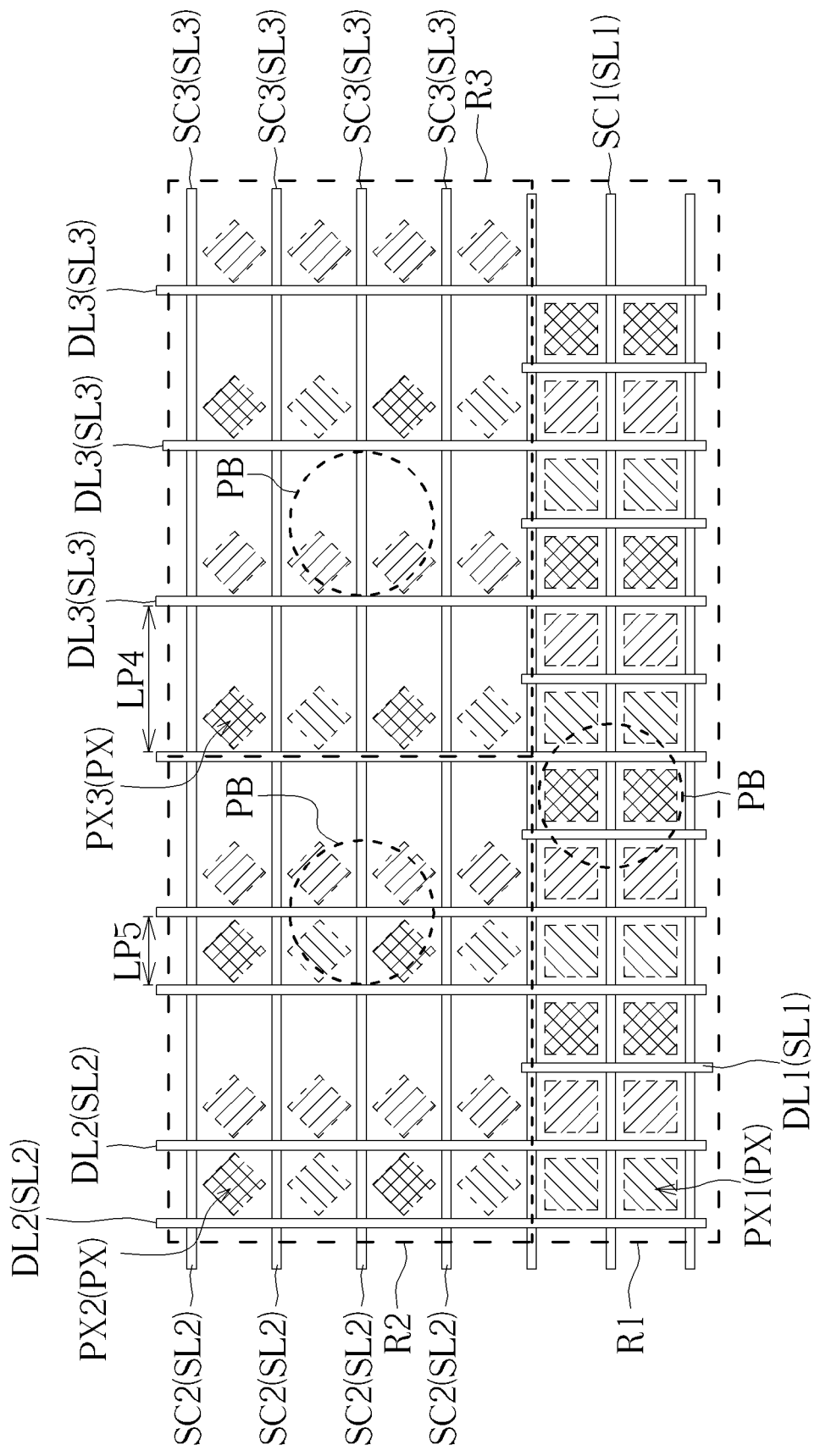
FIG. 4 schematically illustrates a pixel of a display panel according to a variant embodiment of the first embodiment of the present disclosure.

Referring to FIG. 4, FIG. 4 schematically illustrates a pixel of a display panel according to a variant embodiment of the first embodiment of the present disclosure. One of the differences between the present variant embodiment and the first embodiment shown in FIG. 2 is the arrangement of the pixels. According to the present variant embodiment, the arrangement of the pixels in the first area R1 may be the same as the arrangement of the pixels in the first area R1 shown in FIG. 2, and the pixels in the second area R2 and the third area R3 may be arranged in a different way, but not limited thereto. In detail, as shown in FIG. 4, the arrangement of the pixels in the second area R2 and the third area R3 may for example be a pentile arrangement, and the arrangement of the pixels in the first area R1 may be the same as the arrangement shown in FIG. 2 (such as a traditional RGB arrangement) or may include other arrangement ways other than the pentile arrangement, but not limited thereto. According to the present embodiment, since the arrangement of the second pixels PX2 in the second area R2 and the arrangement of the third pixels PX3 in the third area R3 may be the pentile arrangement, it can still provide a good visual effect under the condition that the number of the second pixels PX2 in the second area R2 and the number of the third pixels PX3 in the third area R3 are reduced (that is, the density of the second pixels PX2 and the density of the third pixels PX3 are lower than the density of the first pixels PX1). In addition, since the line pitch of a portion of the third signal lines SL3 (such as the third data lines DL3 shown in FIG. 4) in the third area R3 may be greater than that the line pitch of a portion of the second signal lines SL2 (such as the second data lines DL2 shown in FIG. 4) in the second area R2 (for example, the line pitch LP4 between adjacent two of the third data lines DL3 may be greater than the line pitch LP5 between adjacent two of the second data lines DL2, as shown in FIG. 4), the density of the third pixels PX3 may be lower than the density of the second pixels PX2 in the present embodiment, but not limited thereto. Because the density of the first pixels PX1, the density of the second pixels PX2 and the density of the third pixels PX3 may be different from each other in the present embodiment, the transmittance of the first area R1, the transmittance of the second area R2 and the transmittance of the third area R3 may be different from each other, and because the density of the third pixels PX3 is lower than the density of the second pixels PX2, and the density of the second pixels PX2 is lower than the density of the first pixels PX1, the transmittance of the third area R3 may be greater than the transmittance of the second area R2, and the transmittance of the second area R2 may be greater than the transmittance of the first area R1 in the present variant embodiment, but not limited thereto. In addition, as shown in FIG. 4, the measurement of the transmittances of the first area R1, the second area R2 and the third area R3 of the present variant embodiment may be performed by using a probe PB with a fixed size (such as 1 centimeter (cm)*1 cm, 1 mm*1 mm or 2 mm*2 mm) to measure the average transmittances of the first area R1, the second area R2 and the third area R3 respectively in the visible light band, and the area of the first area R1, the area of the second area R2 and the area of the third area R3 may be the measured area of the probe PB. In detail, the transmittance of the present disclosure is the ratio (percentage) of the measured intensity of the penetrated light after the light source penetrates an area (such as the first area R1, the second area R2, and/or the third area R3) divided by the measured intensity of the light source not penetrating the area. The light intensity of the present disclosure may be the integral value of the spectrum of the light source (the light source may for example include display light or ambient light), and the light source may for example include visible light, wherein the wavelength of the visible light may range from 380 nanometers (nm) to 780 nm, but not limited thereto. For example, when the light source is a visible light, the intensity of the light may be the integral value of the spectrum of the light from 380 nm to 780 nm, and the transmittances of the first area R1, the second area R2 and the third area R3 may be the ratio (percentage) of the integral value of the spectrum of the visible light measured after the light source penetrates an area divided by the integral value of the spectrum of the visible light measured when the light source does not penetrate the area. The measurement and definition of the transmittance mentioned above may be applied to each of the embodiments and variant embodiments of the present disclosure, and will not be redundantly described in the following.

Figure 5:
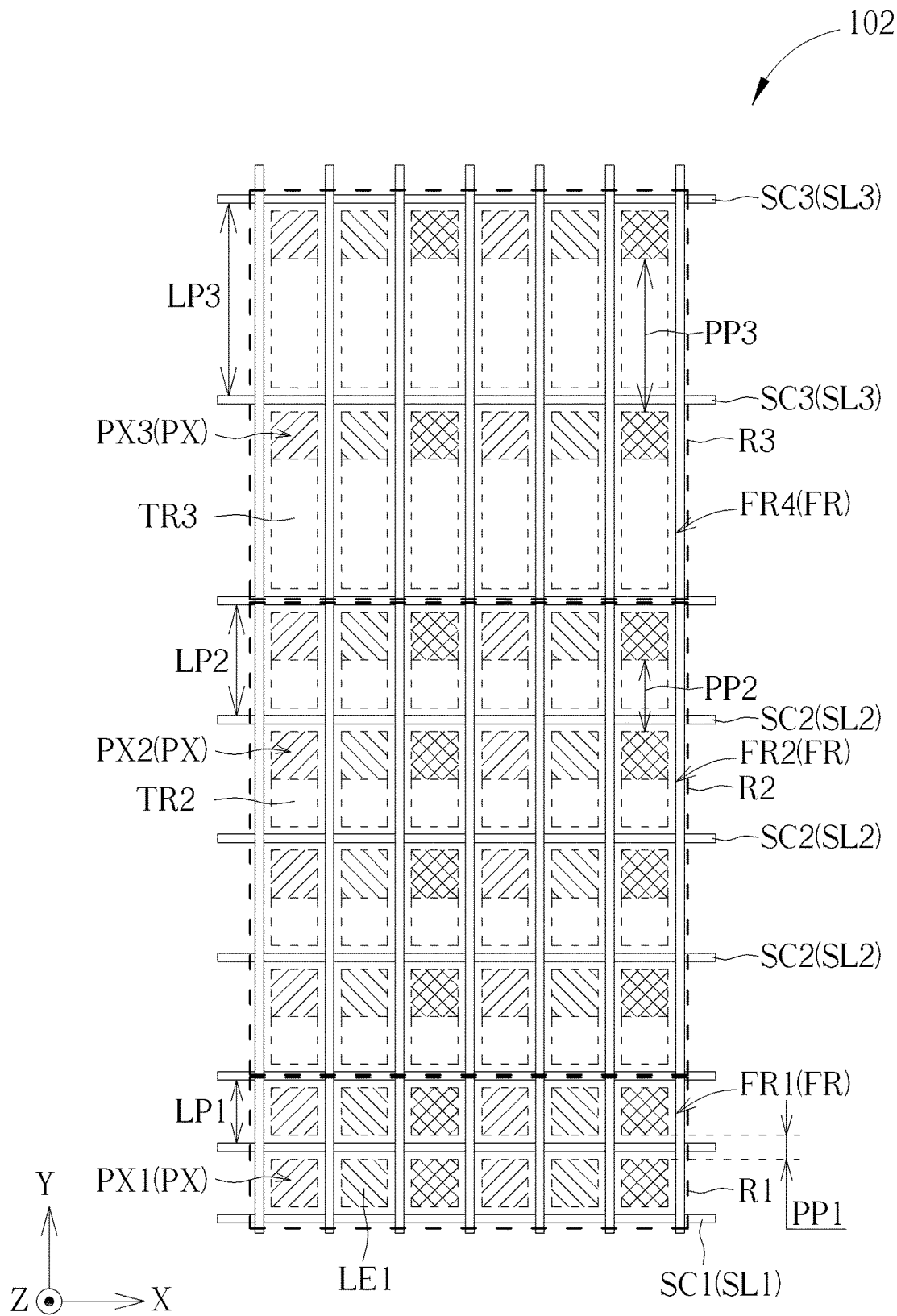
FIG. 5 schematically illustrates pixels of a display panel according to a second embodiment of the present disclosure.

Referring to FIG. 5, FIG. 5 schematically illustrates pixels of a display panel according to a second embodiment of the present disclosure. FIG. 5 shows the designs of the pixels in the first area R1, the second area R2 and the third area R3, wherein the arrangement and the type of the pixels in the first area R1, the second area R2 and the third area R3 may refer to the structure shown in FIG. 2 and the contents of the first embodiment, and will not be redundantly described here. According to the present embodiment, the transmittance of the first area R1, the transmittance of the second area R2 and the transmittance of the third area R3 may be different from each other by making the density of the first pixels PX1, the density of the second pixels PX2 and the density of the third pixels PX3 different form each other. As shown in FIG. 5, the first area R1, the second area R2 and the third area R3 of the display panel 102 may be arranged side by side along a direction (such as the second direction Y, but not limited thereto) in the present embodiment, and the density of the first pixels PX1, the density of the second pixels PX2 and the density of the third pixels PX3 may be different from each other by making the line pitch LP1 of the first signal lines SL1 in the first area R1, the line pitch LP2 of the second signal lines SL2 in the second area R2 and the line pitch LP3 of the third signal lines SL3 in the third area R3 different from each other, but not limited thereto. For example, as shown in FIG. 5, the line pitch LP1 may be included between adjacent two of the first signal lines SL1 (or first scan lines SC1) in the first area R1, the line pitch LP2 may be included between adjacent two of the second signal lines SL2 (or second scan lines SC2) in the second area R2, and the line pitch LP3 may be included between adjacent two of the third signal lines SL3 (or third scan lines SC3) in the third area R3, wherein the line pitch LP1 may be lower than the line pitch LP2, and the line pitch LP2 may be lower than the line pitch LP3 in the present embodiment, but not limited thereto. Since the line pitch LP1 may be lower than the line pitch LP2, and the line pitch LP2 may be lower than the line pitch LP3, the areas (such as the area FR1) including the first pixels PX1 may for example include the first pixels PX1, the areas (such as the area FR2) including the second pixels PX2 may for example include the second pixels PX2 and the second transparent areas TR2, and the areas (such as the area FR4) including the third pixels PX3 may for example include the third pixels PX3 and the third transparent areas TR3, wherein the area of the third transparent area TR3 may be greater than the area of the second transparent area TR2, but not limited thereto. That is, the density of the first pixels PX1 may be greater than the density of the second pixels PX2, and the density of the second pixels PX2 may be greater than the density of the third pixels PX3, but not limited thereto. In addition, as shown in FIG. 5, the pixel pitch PP1 of the first pixels PX1 may be lower than the pixel pitch PP2 of the second pixels PX2, and the pixel pitch PP2 of the second pixels PX2 may be lower than the pixel pitch PP3 of the third pixels PX3, but not limited thereto. The definition of the density of the pixels, the description of the light emitting region and the transparent area, and the definition of the pixel pitch may refer to the contents in the above-mentioned embodiments, and will not be redundantly described here. Because the density of the third pixels PX3 is lower than the density of the second pixels PX2, and the density of the second pixels PX2 is lower than the density of the first pixels PX1, the transmittance of the third area R3, the transmittance of the second area R2 and the transmittance of the first area R1 may be different from each other in the display panel 102, wherein the transmittance of the third area R3 is greater than the transmittance of the second area R2, and the transmittance of the second area R2 is greater than the transmittance of the first area R1, but not limited thereto. It should be noted that the designs of the first area R1, the second area R2 and the third area R3 shown in FIG. 5 are exemplary, and the present disclosure is not limited thereto.

Figure 6:
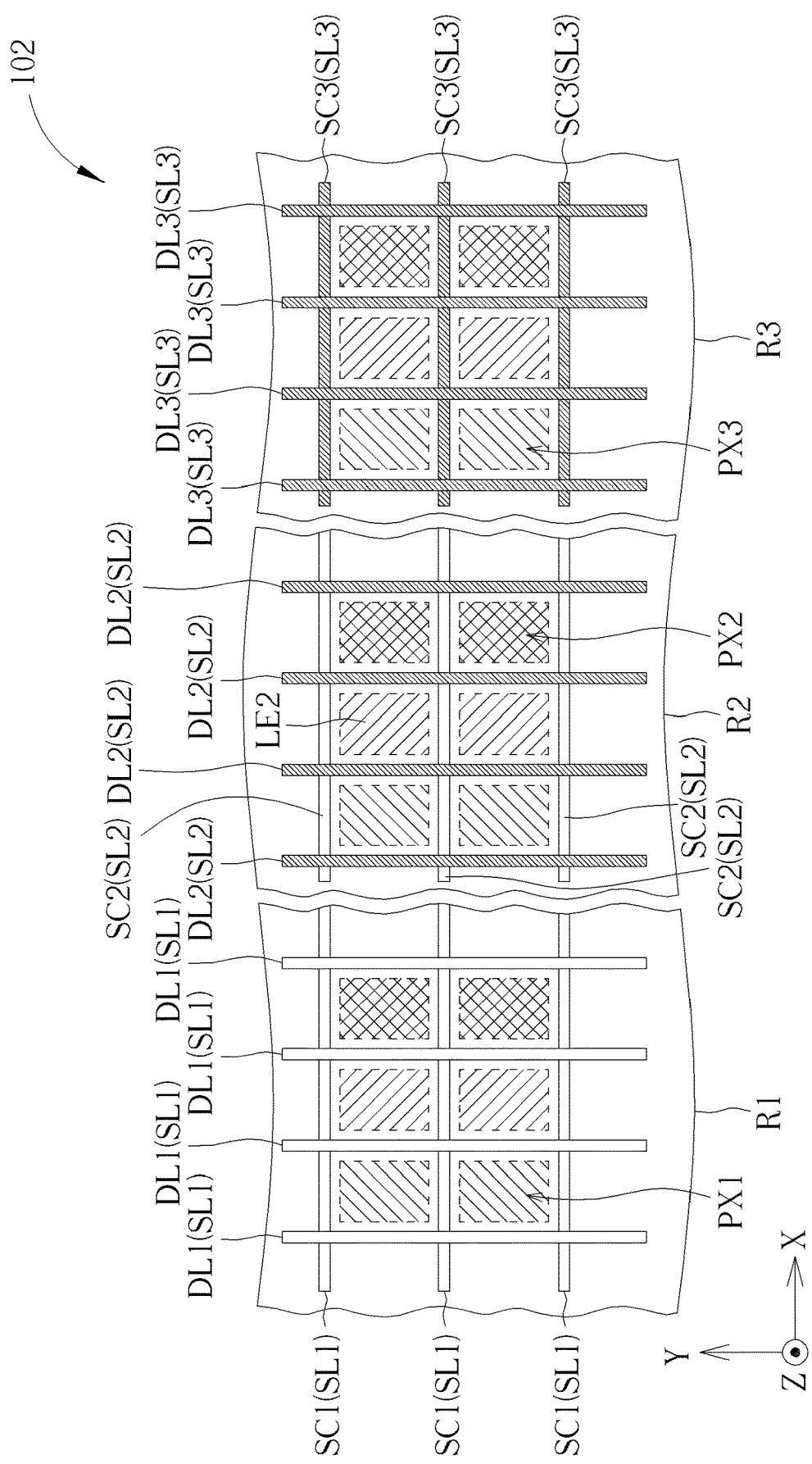
FIG. 6 schematically illustrates pixels of a display panel according to an embodiment of the present disclosure.

Referring to FIG. 6, FIG. 6 schematically illustrates pixels of a display panel according to an embodiment of the present disclosure. It should be noted that FIG. 6 just exemplary shows the designs of the pixels in the first area R1, the second area R2 and the third area R3 of the display panel 102, and the positions of the first area R1, the second area R2 and the third area R3 of the display panel 102 of the present embodiment are not limited to what is shown in FIG. 6. According to the present embodiment, the signal lines in the first area R1, the signal lines in the second area R2 and the signal lines in the third area R3 may be formed of different materials, such that the transmittance of the first area R1, the transmittance of the second area R2 and the transmittance of the third area R3 may be different from each other. For example, a portion of the signal lines may be formed of transparent materials, and a portion of the signal lines may be formed of low light transmission materials, but not limited thereto. In detail, as shown in FIG. 6, the first area R1 of the display panel 102 may include the plurality of first signal lines SL1 and the plurality of first pixels PX1, wherein a portion of the first signal lines SL1 extending along the first direction X may for example be the first scan lines SC1, and another portion of the first signal lines SL1 extending along the second direction Y may for example be the first data lines DL1. The second area R2 of the display panel 102 may include the plurality of second signal lines SL2 and the plurality of second pixels PX2, wherein a portion of the second signal lines SL2 extending along the first direction X may for example be the second scan lines SC2, and another portion of the second signal lines SL2 extending along the second direction Y may for example be the second data lines DL2. The third area R3 of the display panel 102 may include the plurality of third signal lines SL3 and the plurality of third pixels PX3, wherein a portion of the third signal lines SL3 extending along the first direction X may for example be the third scan lines SC3, and another portion of the third signal lines SL3 extending along the second direction Y may for example be the third data lines DL3. The description of the first pixels PX1, the second pixels PX2 and the third pixels PX3 may refer to the contents of the above-mentioned embodiments, and will not be redundantly described here. According to the present embodiment, the first signal lines SL1 in the first area R1 may include opaque metal conductive materials, or in other words, the first scan lines SC1 and the first data lines DL1 of the first signal lines SL1 may include opaque metal conductive materials, but not limited thereto. A portion of the second signal lines SL2 in the second area R2 may include opaque metal conductive materials, and another portion of the second signal lines SL2 in the second area R2 may include transparent conductive materials. For example, as shown in FIG. 6, the second scan lines SC2 of the second signal lines SL2 may include opaque metal conductive materials, and the second data lines DL2 of the second signal lines SL2 may include transparent conductive materials, but not limited thereto. The third signal lines SL3 in the third area R3 may include transparent conductive materials, or in other words, the third scan lines SC3 and the third data lines DL3 of the third signal lines SL3 may include transparent conductive materials, but not limited thereto. In the present embodiment, the transparent conductive materials may include metal oxides, other suitable transparent conductive materials or the combinations of the above-mentioned materials, but not limited thereto. The metal oxide may for example include indium tin oxide (ITO), indium zinc oxide (IZO), other suitable materials or the combinations of the above-mentioned materials, but not limited thereto. According to the present embodiment, because a portion of the second signal lines SL2 (such as the second data lines DL2) in the second area R2 and the third signal lines SL3 in the third area R3 may include the transparent conductive materials, and the first signal lines SL1 in the first area R1 may include the opaque metal conductive materials, the transmittance of the first area R1, the transmittance of the second area R2 and the transmittance of the third area R3 may be different form each other, wherein the transmittance of the first area R1 may be lower than the transmittance of the second area R2 and the transmittance of the third area R3. In addition, because the third signal lines SL3 include a greater amount of the transparent conductive materials than the second signal lines SL2, the transmittance of the third area R3 may be greater than the transmittance of the second area R2, and the transmittance of the second area R2 may be greater than the transmittance of the first area R1, but not limited thereto. "The third signal lines SL3 include a greater amount of the transparent conductive materials than the second signal lines SL2" mentioned above may for example represents that the density of the portion of the third signal lines SL3 including the transparent conductive materials is greater than the density of the portion of the second signal lines SL2 including the transparent conductive materials or the number of the portion of the third signal lines SL3 including the transparent conductive materials is greater than the number of the portion of the second signal lines SL2 including the transparent conductive materials, but the present disclosure is not limited thereto. In addition, because the transmittance of the first area R1, the transmittance of the second area R2 and the transmittance of the third area R3 may be different from each other by including the transparent conductive materials in a portion of the first signal lines SL1, the second signal lines SL2 and the third signal lines SL3 in the present embodiment, the density of the first pixels PX1 in the first area R1, the density of the second pixels PX2 in the second area R2 and the density of the third pixels PX3 in the third area R3 may be the same in the present embodiment, but not limited thereto. The definition of the densities of the first pixels PX1, the second pixels PX2 and the third pixels PX3 may refer to the contents of the first embodiment, and will not be redundantly described here. It should be noted that although FIG. 6 only shows the structure that the signal lines include the scan lines and the data lines, the present disclosure is not limited thereto. In some embodiments, the first signal lines SL1, the second signal lines SL2 and the third signal lines SL3 may further include power lines (or VDD signal lines, not shown in FIG. 6), wherein the transmittance of the first area R1, the transmittance of the second area R2 and the transmittance of the third area R3 may be different from each other by making a portion of the power lines of the first signal lines SL1, the second signal lines SL2 and the third signal lines SL3 include the transparent conductive materials. In addition, the designs of the first signal lines SL1, the second signal lines SL2 and the third signal lines SL3 of the present embodiment are not limited to what is shown in FIG. 6. In some embodiments, the first signal lines SL1 may include the opaque metal conductive materials, the second scan lines SC2 of the second signal lines SL2 may include the transparent conductive materials, the second data lines DL2 of the second signal lines SL2 may include the opaque metal conductive materials, and the third signal lines SL3 may include the transparent conductive materials. In some embodiments, the first signal lines SL1, the second signal lines SL2 and the third signal lines SL3 may include the transparent conductive materials, wherein the third signal lines SL3 may include a greater amount of the transparent conductive materials than the second signal lines SL2, and the second signal lines SL2 may include a greater amount of the transparent conductive materials than the first signal lines SL1, but not limited thereto. The material design of the signal lines mentioned in the present embodiment may be applied to each of the embodiments and variant embodiments of the present disclosure, and will not be redundantly described.

Figure 7:
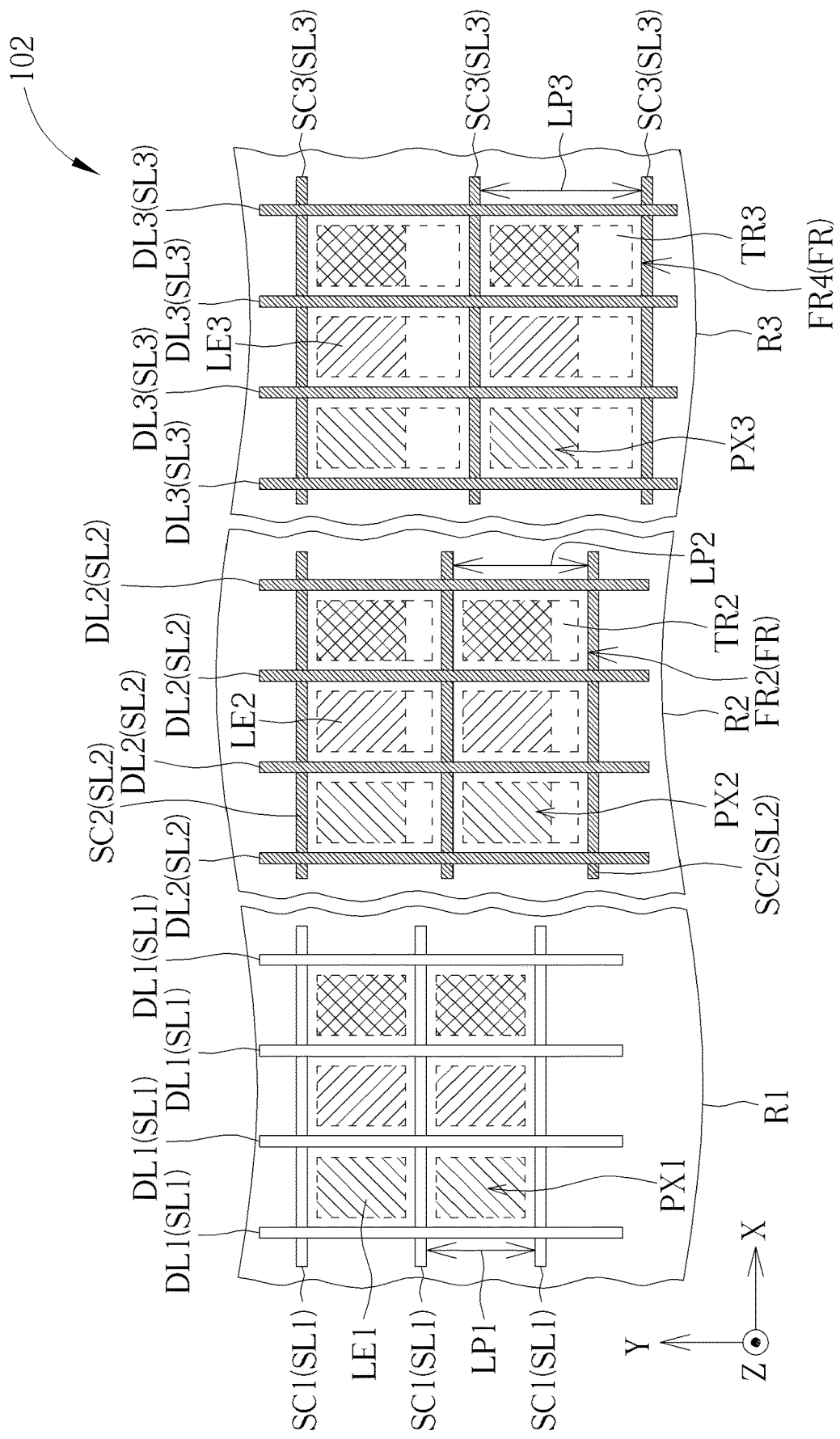
FIG. 7 schematically illustrates pixels of a display panel according to an embodiment of the present disclosure.

Referring to FIG. 7, FIG. 7 schematically illustrates pixels of a display panel according to an embodiment of the present disclosure. It should be noted that FIG. 7 just exemplary shows the designs of the pixels in the first area R1, the second area R2 and the third area R3 of the display panel 102, and the positions of the first area R1, the second area R2 and the third area R3 of the display panel 102 of the present embodiment are not limited to what is shown in FIG. 7. As shown in FIG. 7, the display panel 102 may include the first area R1, the second area R2 and the third area R3, wherein the first area R1 includes the plurality of first signal lines SL1 and the plurality of first pixels PX1, the second area R2 includes the plurality of second signal lines SL2 and the plurality of second pixels PX2, and the third area R3 includes the plurality of third signal lines SL3 and the plurality of third pixels PX3. According to the present embodiment, the transmittance of the first area R1, the transmittance of the second area R2 and the transmittance of the third area R3 may be different from each other by making the density of the first pixels PX1, the density of the second pixels PX2 and the density of the third pixels PX3 different from each other and by including the transparent conductive materials in a portion of the first signal lines SL1, the second signal lines SL2 and the third signal lines SL3. In detail, as shown in FIG. 7, the line pitch LP1 between adjacent two of the first scan lines SC1 in the first area R1 may be lower than the line pitch LP2 between adjacent two of the second scan lines SC2 in the second area R2, and the line pitch LP2 between adjacent two of the second scan lines SC2 in the second area R2 may be lower than the line pitch LP3 between adjacent two of the third scan lines SC3 in the third area R3. In the embodiment shown in FIG. 7, the first pixel PX1, the second pixel PX2 and the third pixel PX3 may substantially have the same area, but the present disclosure is not limited thereto. In addition, the areas FR (such as the area FR2) including the second pixels PX2 may further include the second transparent areas TR2 in addition to the second pixels PX2, and the areas FR (such as the area FR4) including the third pixels PX3 may further include the third transparent areas TR3 in addition to the third pixels PX3, wherein the area of a third transparent area TR3 may be greater than the area of a second transparent area TR2, but not limited thereto. Therefore, the density of the first pixels PX1 may be greater than the density of the second pixels PX2, and the density of the second pixels PX2 may be greater than the density of the third pixels PX3, as shown in FIG. 7, but not limited thereto. The definitions of the densities of the first pixels PX1, the second pixels PX2 and the third pixels PX3 may refer to the contents of the first embodiment, and will not be redundantly described here. In addition, the first signal lines SL1 may include the opaque metal conductive materials, and the second signal lines SL2 and the third signal lines SL3 may include the transparent conductive materials in the present embodiment. The examples of the metal conductive materials and the transparent conductive materials may refer to the contents in the above-mentioned embodiment, and will not be redundantly described. Because the density of the first pixels PX1, the density of the second pixels PX2 and the density of the third pixels PX3 are different from each other, and the first signal lines SL1, the second signal lines SL2 and the third signal lines SL3 may include different types of conductive materials, the transmittance of the first area R1, the transmittance of the second area R2 and the transmittance of the third area R3 may be different from each other, wherein the transmittance of the first area R1 may be lower than the transmittance of the second area R2, and the transmittance of the second area R2 may be lower than the transmittance of the third area R3, but not limited thereto. It should be noted that the designs of the pixels in different areas shown in the present embodiment are not limited to what is shown in FIG. 7. In some embodiment, a portion of the second signal lines SL2 may include the transparent conductive materials, for example, the second data lines DL2 or the second scan lines SC2 of the second signal lines SL2 may include the transparent conductive materials, and the remaining portion of the second signal lines SL2 may include the opaque metal conductive materials; the third data lines DL3 or the third scan lines SC3 of the third signal lines SL3 may include the transparent conductive materials, and the remaining portion of the third signal lines SL3 may include the opaque metal conductive materials, but not limited thereto. The designs of the pixels in the first area R1, the second area R2 and the third area R3 mentioned in the present embodiment may be applied to each of the embodiments and variant embodiments of the present disclosure.

Figure 8:
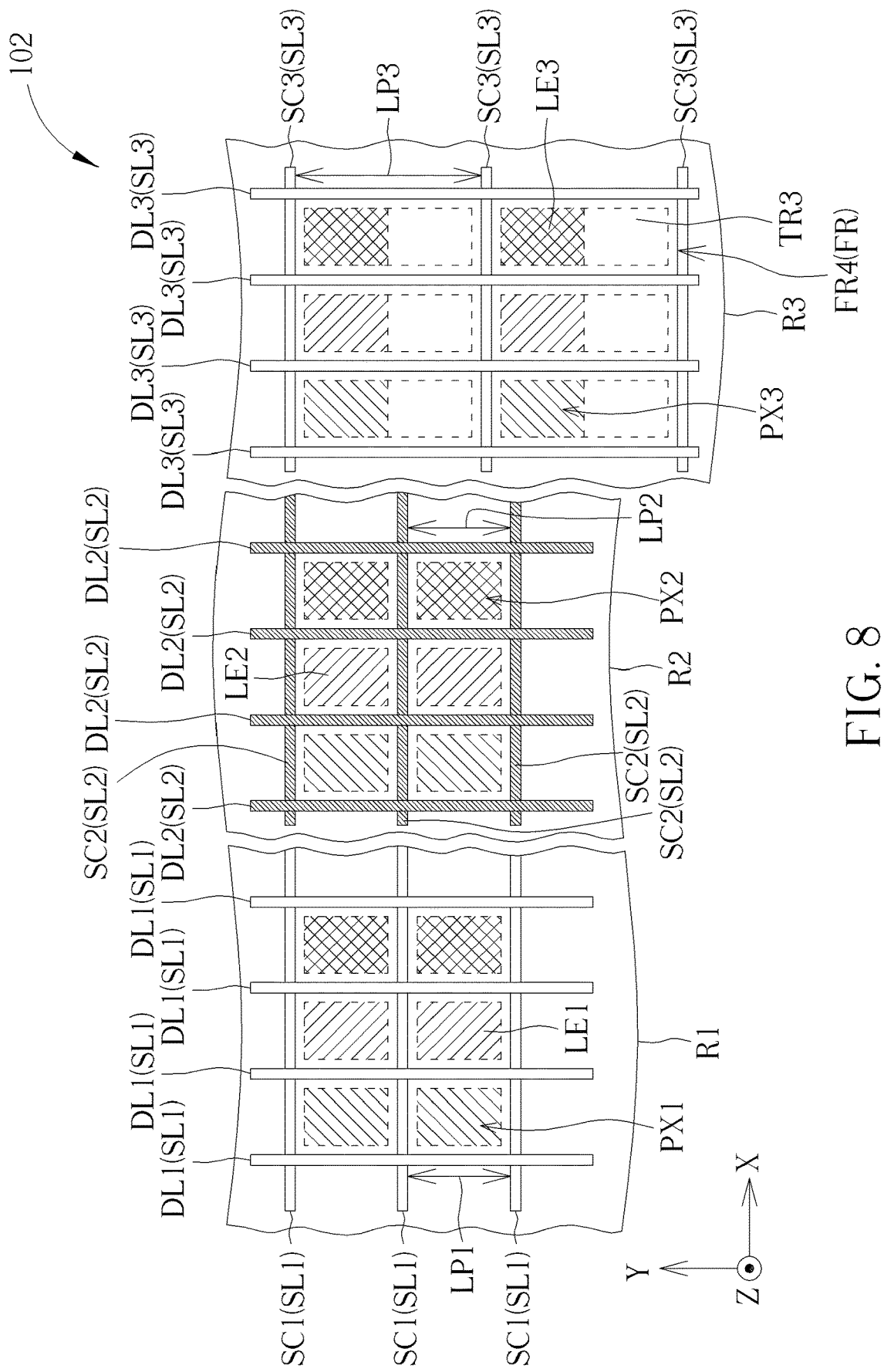
FIG. 8 schematically illustrates pixels of a display panel according to an embodiment of the present disclosure.

Referring to FIG. 8, FIG. 8 schematically illustrates pixels of a display panel according to an embodiment of the present disclosure. It should be noted that FIG. 8 just exemplary shows the designs of the pixels in the first area R1, the second area R2 and the third area R3 of the display panel 102, and the positions of the first area R1, the second area R2 and the third area R3 of the display panel 102 of the present embodiment are not limited to what is shown in FIG. 8. According to the present embodiment, the transmittance of the first area R1, the transmittance of the second area R2 and the transmittance of the third area R3 may be different from each other by making the density of the first pixels PX1 and the density of the second pixels PX2 different from the density of the third pixels PX3 and by making the second signal lines SL2 include the transparent conductive materials, but not limited thereto. For example, as shown in FIG. 8, the line pitch LP1 between adjacent two of the first scan lines SC1 in the first area R1 may be the same as the line pitch LP2 between adjacent two of the second scan lines SC2 in the second area R2, which is lower than the line pitch LP3 between adjacent two of the third scan lines SC3 in the third area R3. In addition, the areas (such as the area FR4) including the third pixels PX3 may further include the third transparent areas TR3 in addition to the third pixels PX3, but not limited thereto. Therefore, the density of the first pixels PX1 may be the same as the density of the second pixels PX2, which is greater than the density of the third pixels PX3. In addition, as shown in FIG. 8, the second signal lines SL2 may include the transparent conductive materials, but not limited thereto. Since the second signal lines SL2 may include the transparent conductive materials, the transmittance of the second area R2 may be greater than the transmittance of the first area R1. In addition, since the density of the third pixels PX3 is lower than the density of the second pixels PX2 and the density of the first pixels PX1, the transmittance of the third area R3 may be greater than the transmittance of the second area R2 and the transmittance of the first area R1, but not limited thereto. In some embodiments, a portion of the second signal lines SL2 may include the transparent conductive materials, for example, the second data lines DL2 of the second signal lines SL2 may include the transparent conductive materials, and the second scan lines SC2 of the second signal lines SL2 may include low light transmission materials such as opaque metal conductive materials, but not limited thereto. In some embodiments, the first signal lines SL1, the second signal lines SL2 and the third signal lines SL3 may include power lines (or VDD signal lines), wherein the power lines of the second signal lines SL2 may include the transparent conductive materials, but not limited thereto. The designs of the pixels in the first area R1, the second area R2 and the third area R3 mentioned in the present embodiment may be applied to each of the embodiments and variant embodiments of the present disclosure.

Figure 9:
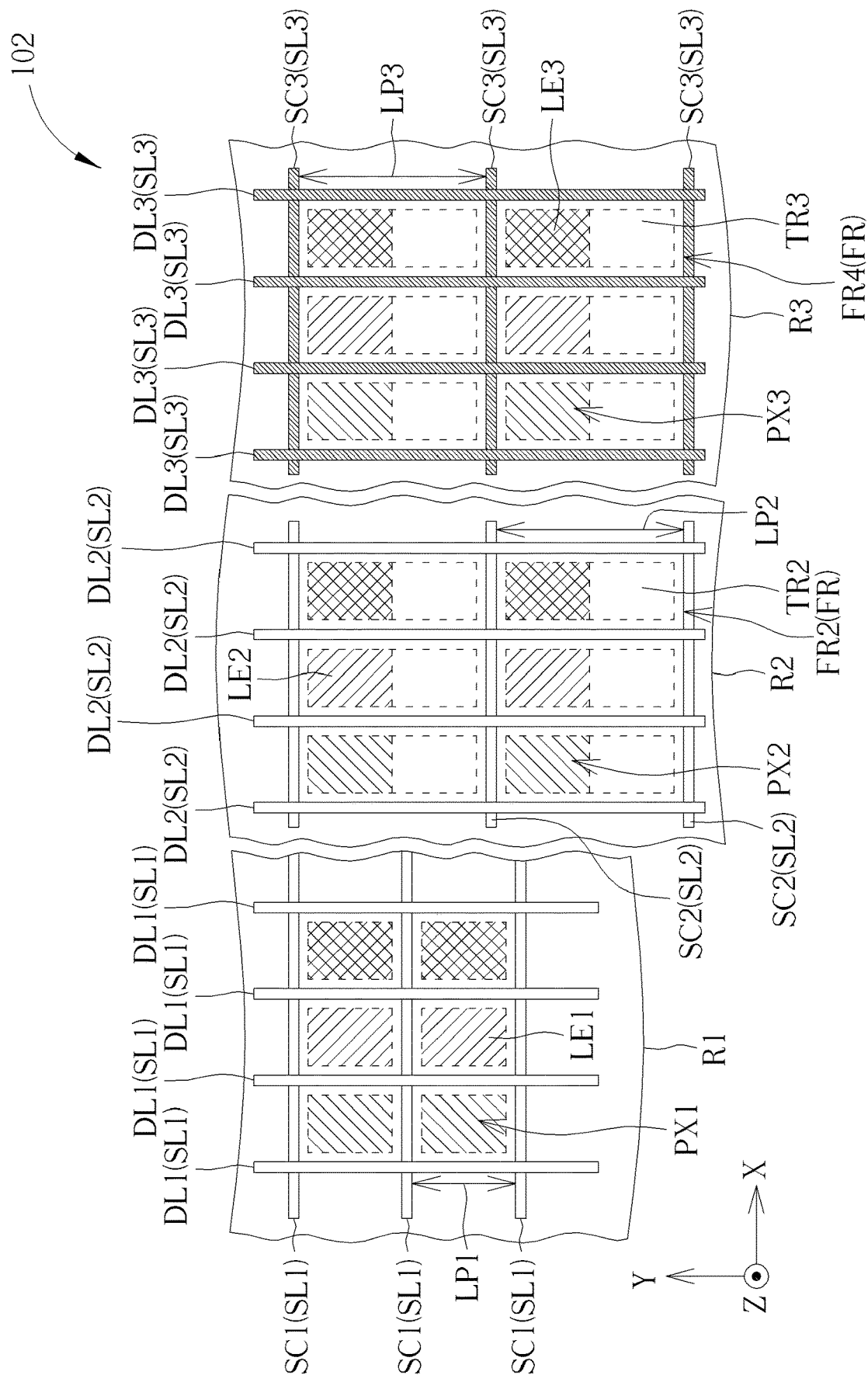
FIG. 9 schematically illustrates pixels of a display panel according to an embodiment of the present disclosure.

Referring to FIG. 9, FIG. 9 schematically illustrates pixels of a display panel according to an embodiment of the present disclosure. It should be noted that FIG. 9 just exemplary shows the designs of the pixels in the first area R1, the second area R2 and the third area R3 of the display panel 102, and the positions of the first area R1, the second area R2 and the third area R3 of the display panel 102 of the present embodiment are not limited to what is shown in FIG. 9. According to the present embodiment, the transmittance of the first area R1, the transmittance of the second area R2 and the transmittance of the third area R3 may be different from each other by making the density of the second pixels PX2 and the density of the third pixels PX3 different from the density of the first pixels PX1 and by making the third signal lines SL3 include the transparent conductive materials, but not limited thereto. For example, as shown in FIG. 9, the line pitch LP1 between adjacent two of the first scan lines SC1 in the first area R1 may be lower than the line pitch LP2 between adjacent two of the second scan lines SC2 in the second area R2 and the line pitch LP3 between adjacent two of the third scan lines SC3 in the third area R3. In addition, the areas FR (such as the area FR2) including the second pixels PX2 may further include the second transparent areas TR2 in addition to the second pixels PX2, and the areas FR (such as the area FR4) including the third pixels PX3 may further include the third transparent areas TR3 in addition to the third pixels PX3, wherein the area of a second transparent area TR2 may be the same as the area of a third transparent area TR3, but not limited thereto. Therefore, the density of the second pixels PX2 may be the same as the density of the third pixels PX3, which may for example lower than the density of the first pixels PX1. In addition, the third signal lines SL3 may include the transparent conductive materials, but not limited thereto. Since the third signal lines SL3 may include the transparent conductive materials, the transmittance of the third area R3 may be greater than the transmittance of the second area R2. In addition, since the density of the first pixels PX1 may be greater than the density of the second pixels PX2 and the density of the third pixels PX3, the transmittance of the first area R1 may be lower than the transmittance of the second area R2 and the transmittance of the third area R3, but not limited thereto. In some embodiments, a portion of the third signal lines SL3 may include the transparent conductive materials, for example, the third scan lines SC3 of the third signal lines SL3 may include the transparent conductive materials, and the third data lines DL3 of the third signal lines SL3 may include the opaque metal conductive materials, but not limited thereto. In some embodiments, the first signal lines SL1, the second signal lines SL2 and the third signal lines SL3 may include power lines (or VDD signal lines), wherein the power lines of the third signal lines SL3 may include the transparent conductive materials, but not limited thereto. The designs of the pixels in the first area R1, the second area R2 and the third area R3 mentioned in the present embodiment may be applied to each of the embodiments and variant embodiments of the present disclosure.

Figure 10:
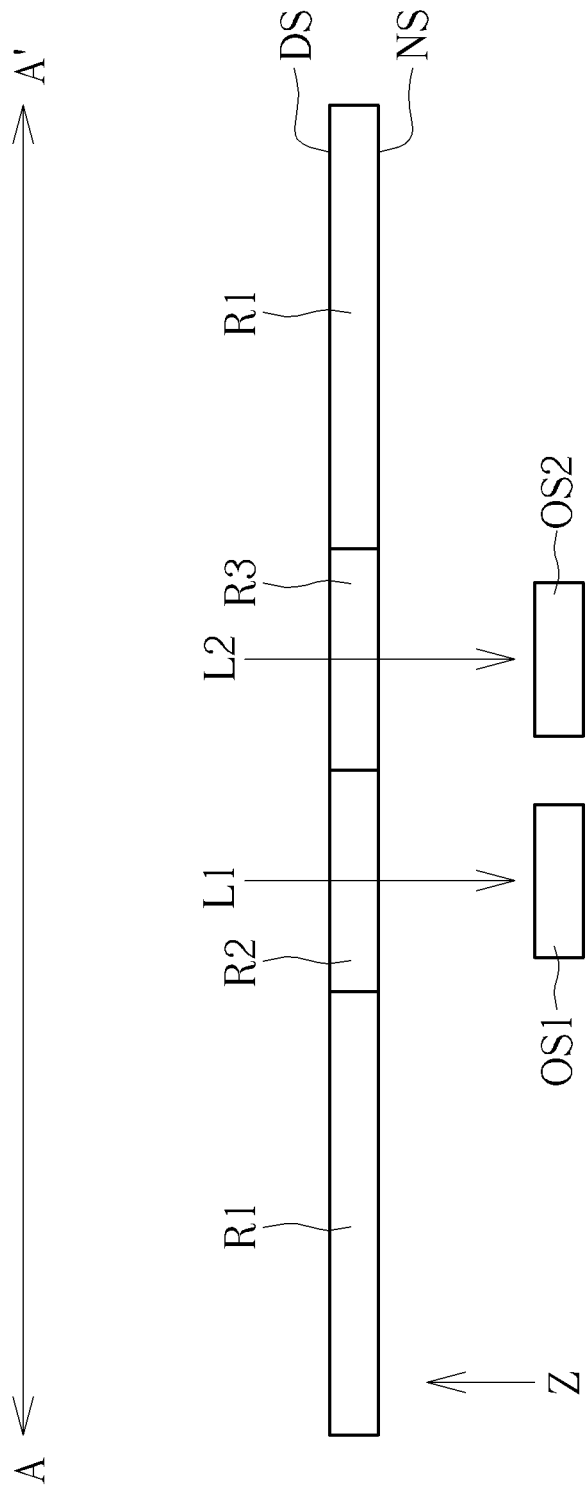
FIG. 10 schematically illustrates a cross-sectional view of an electronic device according to the first embodiment of the present disclosure.

Referring to FIG. 10, FIG. 10 schematically illustrates a cross-sectional view of an electronic device according to the first embodiment of the present disclosure, wherein FIG. 10 is the cross-sectional diagram of the electronic device 100 shown in FIG. 1 along the cut line A-A'. As shown in FIG. 10, the electronic device 100 may further include a first optical sensing module OS1 and a second optical sensing module OS2 in addition to the display panel 102 mentioned above. It should be noted that in order to simplify the figure, FIG. 10 only exemplarily shows the structure of the display panel 102 and the optical sensing modules, while other elements or layers of the electronic device 100 are omitted. In addition, the display panel 102 is shown as a single layer in FIG. 10, but the present disclosure is not limited thereto. The elements or the layers included in the display panel 102 may refer to the contents mentioned above, and will not be redundantly described here. According to the present embodiment, as shown in FIG. 10, the first optical sensing module OS1 of the electronic device 100 may for example be disposed corresponding to the second area R2 of the display panel 102, and the second optical sensing module OS2 of the electronic device 100 may for example be disposed corresponding to the third area R3 of the display panel 102, but not limited thereto. "The optical sensing module is disposed corresponding to the area" mentioned above means that the light mainly detected by the optical sensing module may pass through the area corresponding to the optical sensing module. In detail, the display panel 102 of the present embodiment may include a display side DS and a non-display side NS, wherein the display side DS may be the side of the display panel 102 for displaying images, and the non-display side NS may be another side of the display panel 102 not display image. As shown in FIG. 10, the first optical sensing module OS1 may be disposed on the non-display side NS of the display panel 102 corresponding to the second area R2 in a top view direction (such as the direction Z) of the display panel 102, or in other words, the first optical sensing module OS1 may be partially overlapped with the second area R2 in the top view direction. Therefore, the light mainly detected by the first optical sensing module OS1 may pass through the second area R2 of the display panel 102. The second optical sensing module OS2 may be disposed on the non-display side NS of the display panel 102 corresponding to the third area R3 in the top view direction (such as the direction Z) of the display panel 102, or in other words, the second optical sensing module OS2 may be partially overlapped with the third area R3 in the top view direction. Therefore, the light mainly detected by the second optical sensing module OS2 may pass through the third area R3 of the display panel 102, but not limited thereto. In the present embodiment, when the first optical sensing module OS1 and/or the second optical sensing module OS2 is in an off state, the combination of the first area R1, the second area R2 and the third area R3 may be regarded as the display region DR mentioned above (shown in FIG. 1) for displaying images, and when the first optical sensing module OS1 and/or the second optical sensing module OS2 is in an on state and being operated, the first optical sensing module OS1 and the second optical sensing module OS2 may respectively receive the light passing through the second area R2 and the third area R3 and convert them into corresponding signals to perform other functions, but not limited thereto. In detail, as shown in FIG. 10, when the first optical sensing module OS1 and/or the second optical sensing module OS2 is in an on state and being operated, the first optical sensing module OS1 may receive the light L1 passing through the second area R2, and the second optical sensing module OS2 may receive the light L2 passing through the third area R3, but not limited thereto. According to the present embodiment, the first optical sensing module OS1 may for example be served to detect non-visible light, and the second optical sensing module OS2 may for example be served to detect visible light. That is, the light L1 shown in FIG. 10 may for example include non-visible light such as infrared light, and the light L2 shown in FIG. 10 may for example include visible light, but not limited thereto. According to the present embodiment, the first optical sensing module OS1 may for example include an infrared sensor or other non-visible light sensors, wherein the infrared sensor may for example be served for iris recognition, fingerprint recognition, face recognition, distance sensing or other functions, and the second optical sensing module OS2 may for example include a camera or other visible light sensors, but not limited thereto. It should be noted that the number of the first optical sensing modules OS1 and the number of the second optical sensing modules OS2 shown in FIG. 10 are exemplary, and the present disclosure is not limited thereto. In some embodiments, the number of the first optical sensing modules OS1 and the number of the second optical sensing modules OS2 disposed corresponding to the second area R2 and the third area R3 of the display panel 102 respectively may more than one according to the designs of the electronic device. According to the present embodiment, as mentioned above, because the transmittance of the first area R1, the transmittance of the second area R2 and the transmittance of the third area R3 may be different from each other in the display panel 102, wherein the transmittance of the third area R3 may be greater than the transmittance of the second area R2, and the transmittance of the second area R2 may be greater than the transmittance of the first area R1, the optical sensing modules of the electronic device 100 may be disposed corresponding to the second area R2 and/or the third area R3 which have greater transmittances. In addition, the electronic device 100 of the present embodiment may for example include the first optical sensing module OS1 for detecting non-visible light and the second optical sensing module OS2 for detecting visible light, wherein the requirement of transmittance of the visible light sensor (the second optical sensing module OS2) may be higher than the requirement of transmittance of the non-visible light sensor (the first optical sensing module OS1) in a relative wavelength band. Therefore, the first optical sensing module OS1 may for example be disposed corresponding to the second area R2, and the second optical sensing module OS2 may for example be disposed corresponding to the third area R3, but not limited thereto. That is, because the display panel 102 of the present embodiment may include the first area R1, the second area R2 and the third area R3 with different transmittances, when the display panel 102 is applied to the electronic device 100 including the optical sensing modules (such as the first optical sensing module OS1 and/or the second optical sensing module OS2), the optical sensing modules may be disposed corresponding to the first area R1, the second area R2 and the third area R3 according to the requirements of the transmittance of the optical sensing modules, such that the functions of the optical sensing modules may be improved. It should be noted that structure shown in FIG. 10 that the first optical sensing module OS1 is disposed corresponding to the second area R2 and the second optical sensing module OS2 is disposed corresponding to the third area R3 is just exemplary, and the present disclosure is not limited thereto. In some embodiments, the relationship between the transmittance of the first area R1, the transmittance of the second area R2 and the transmittance of the third area R3 in the display panel 102 may be different from the relationship described in the present embodiment according to the designs of the electronic device 100, and the optical sensing modules of the electronic device 100 may be disposed corresponding to the specific areas of the display panel 102 according to the requirements of the transmittance of the optical sensing modules, the present disclosure is not limited thereto.

In summary, a display panel and an electronic device including the display panel is provided by the present disclosure. The display panel includes a first area, a second area and a third area, wherein the transmittance of the first area, the transmittance of the second area and the transmittance of the third area may be different from each other. Because the display panel may include the areas with different transmittances, when the display panel is applied to the electronic device including various kinds of optical sensing modules, the optical sensing modules may be disposed corresponding to the specific areas of the display panel according to the requirements of the transmittance of the optical sensing modules to improve the functions of the optical sensing modules of the electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a display panel, comprising:
      a first area which comprises a plurality of first pixels and a plurality of first signal lines electrically connected with the first pixels; and
      a second area which comprises a plurality of second pixels, a plurality of transparent areas and a plurality of second signal lines electrically connected with the second pixels, wherein the plurality of second signal lines cross each other to form the plurality of transparent areas, each of the plurality of second pixels includes a light emitting region, a length of one of the light emitting regions of the plurality of second pixels is different from a length of one of the plurality of transparent areas in an extending direction of one of the plurality of second signal lines, and a transmittance of the second area is greater than a transmittance of the first area;
   a first optical sensing module disposed corresponding to the first area; and
   a second optical sensing module disposed corresponding to the second area,
   wherein the first optical sensing module is different from the second optical sensing module.

2. The electronic device as claimed in claim 1, wherein the second optical sensing module is capable of detecting visible light.

3. The electronic device as claimed in claim 1, wherein the first optical sensing module is capable of detecting non-visible light.

4. The electronic device as claimed in claim 1, wherein the display panel further comprises a third area, and a transmittance of the third area is different from the transmittance of the first area and the transmittance of the second area.

5. The electronic device as claimed in claim 4, wherein the transmittance of the third area is less than the transmittance of the second area.

6. The electronic device as claimed in claim 1, wherein at least one of the first signal lines and the second signal lines comprises transparent material.

7. The electronic device as claimed in claim 1, wherein the first pixels have a first pixel pitch, the second pixels have a second pixel pitch, and the first pixel pitch of the first pixels in the first area is different from the second pixel pitch of the second pixels in the second area.

8. The electronic device as claimed in claim 7, wherein the second pixel pitch is greater than the first pixel pitch.

9. The electronic device as claimed in claim 1, wherein the plurality of first signal lines are configured to make the first area has the transmittance of the first area, and the plurality of second signal lines are configured to make the second area has the transmittance of the second area.

10. The electronic device as claimed in claim 1, wherein the plurality of first pixels comprise a first density, the plurality of second pixels comprise a second density, the first density is different from the second density.

11. The electronic device as claimed in claim 1, wherein the first area comprises a first line pitch, the second area comprises a second line pitch, the first line pitch is different from the second line pitch.

12. The electronic device as claimed in claim 1, wherein the plurality of second pixels and the plurality of transparent areas are alternately disposed along the extending direction.

* * * * *